United States Patent [19]

Lindberg

[11] Patent Number: 4,471,314
[45] Date of Patent: Sep. 11, 1984

[54] HYBRID PULSE WIDTH MODULATED AUDIO AMPLIFIER

[76] Inventor: Charles R. Lindberg, 17282 Orange Dr., Yorba Linda, Calif. 92686

[21] Appl. No.: 273,442

[22] Filed: Jun. 15, 1981

[51] Int. Cl.³ .............................................. H03F 3/38
[52] U.S. Cl. ...................................... 330/10; 330/65; 330/251
[58] Field of Search ..................... 330/10, 65, 66, 251, 330/307, 207 A; 357/80

[56] References Cited

U.S. PATENT DOCUMENTS 4,092,610  5/1978  White et al. ...................... 330/10 X
4,292,595  9/1981  Smith ................................... 330/10
4,404,526  9/1983  Kirn ..................................... 330/10

OTHER PUBLICATIONS

Mattera, "Hybrid Monolithic Units Displacing More Discretes," *Electronics*, vol. 49, No. 22, Oct. 28, 1976, pp. 86-89.

*Primary Examiner*—James B. Mullins
*Attorney, Agent, or Firm*—Roberts and Quiogue

[57] ABSTRACT

A high power single or multichanneled pulse width modulated (PWM) audio amplifier is fabricated in a single package using hybrid assembly techniques.

14 Claims, 1 Drawing Figure

HYBRID PULSE WIDTH MODULATED AUDIO AMPLIFIER

BACKGROUND OF THE INVENTION

1. Field of the Invention

This invention relates to the design of a high quality hybrid pulse width modulated (PWM) audio amplifier that is constructed in a single miniature package using what the semiconductor industry terms "hybrid" techniques.

2. Prior Art

The design of linear audio power amplifiers has followed the normal technological base in the electronics industry i.e., there were electron tube amplifiers when electron tubes were the only active power devices, there were transistor amplifiers when descrete transistors were the best available active power devices, there were low power one-chip monolithic amplifiers when technology permitted fabricating several transistors and other passive components together on a single monolithic semiconductor chip, then finally with technology advanced to where it is today there are miniature high power hybrid linear amplifiers. The simplicity of using both the monolithic and hybrid modular linear amplifiers is astonishing. This fact coupled with lower costs, higher reliability, and ease of production has spearheaded these devices into virtually every consumer product requiring some type of audio amplifier.

Although these linear modular power amplifiers obviously exhibit many desirable qualities, they all have one major disadvantage—power efficiency. The efficiency of any device is defined as ratio of the useful output power to the total input power. By definition, any practical linear amplifier, no matter how it is designed, when coupled with a sinewave input, can only have an absolute maximum efficiency of about 60% which occurs at the maximum output power point of the amplifier. As total useful power decreases, so does the efficiency. Therefore, with an ideal linear amplifier we can expect the efficiency range of 0% to 60%. Also, in a real environment, a power audio amplifier cannot be operated near its maximum power output because occasional program spikes would drive the amplifier into saturation causing severe distortion. Taking this into consideration, if we operate the amplifier at its half power point to avoid saturation distortion on peaks in the program material, we end up with an efficiency of only about 40%. Low efficiency results in several detrimental effects: 1. Energy consumption is increased. 2. The requirements for the direct current (D.C.) power supply that normally operates a linear amplifier are greatly increased. 3. Large amounts of wasted heat energy must be dissipated in the output stage making some kind of special heat sinking necessary. Although these detrimental effects are of little consequence in low power amplifiers, they contribute to the fact that high power linear amplifiers are very material intensive i.e., they use large amounts of raw materials such as iron, copper, and aluminum which contributes to their large size, weight, and cost.

In an effort to keep the efficiency as high as possible, especially in the mid to high power range, a pulse width modulated (hereafter referred to as PWM) technique is used. Operating efficiencies of 90% to 95% over all output levels are not unusual when using this technique. Although using this technique to build an audio amplifier is not new, the state of the art in electronics components has just advanced to a point where a complete, high power, PWM audio amplifier can be assembled in a single miniature package using what the semiconductor industry terms "hybrid" techniques. This packaging technique of this PWM amplifier constitutes a significant advance to the state of the art for the following reasons: Although PWM audio amplifiers are not new, their circuit design complexities and assembly costs have held them from the consumer market place which is still totally dominated by linear amplifiers. The unique combination of the arrival of the complex PWM control integrated circuits and high speed output switch transistors coupled with the large scale production savings of the hybrid circuit will, for the first time, allow the more efficient PWM audio amplifiers to enter into a competitive arena with the now dominant high power linear amplifier. Once the hybrid PWM amplifiers receive acceptance in the market, the manufacturers will gain by wider profit margins due to simpler assembly and decreased raw material costs and the consumer will reap the attendant savings of lower cost, higher efficiency smaller size, lighter weight, and more reliable operation.

3. Objects

It is the object of this invention to draw upon two developing technologies i.e., the electronic circuit technology of pulse width modulated (PWM) audio amplifiers and the manufacturing technology of "hybrid" circuit construction and define a new commercially saleable product.

It is also an object of the invention to define a product that has improved technical specifications over the present state of the art, primarily in the areas of power efficiency, size, weight, and reliability.

Another object of the invention is to define a product that will be cost effective to an amplifier manufacturer purchasing the product primarily in the areas of assembly and raw materials costs. The assembly gain is from the ease of implementation of the entire basic audio amplifier in modular form with addition of of only a few external components and a scaled-down power supply. The raw materials cost decrease will be attributed to high power efficiency (90% to 95% typical) which virtually eliminates all heat sinks and reduces the maximum power output required from the power supply by about 50%.

It is the object of the invention to state that the quality, shape, size, and power dissipation required by use of the state of art electronic components to accomplish either a single or multi-channel PWM audio amplifier is an ideal match for integration into a single, compact, power hybrid package.

SUMMARY OF THE INVENTION

Due to recent advances in the state of the art in both pulse width modulation control integrated circuits and switching power devices either bipolar transistors or power field effect transistors; it is now possible and practical to integrate these and other required components onto a single hybrid substrate to originate a new modular building block that would be of great interest to any one designing medium to high power audio amplifiers. The new building block, excluding an external L-C output filter, is a complete single or multiple channel pulse width modulated (PWM) audio amplifier. It has high power efficiency (90 to 95% versus 0 to 60% for existing linear power amplifiers) and because it is built using hybrid technology in a single package it is also small in size, light in weight, more reliable, and very easy to implement.

DETAILED DESCRIPTION OF THE INVENTION

Figure 1:
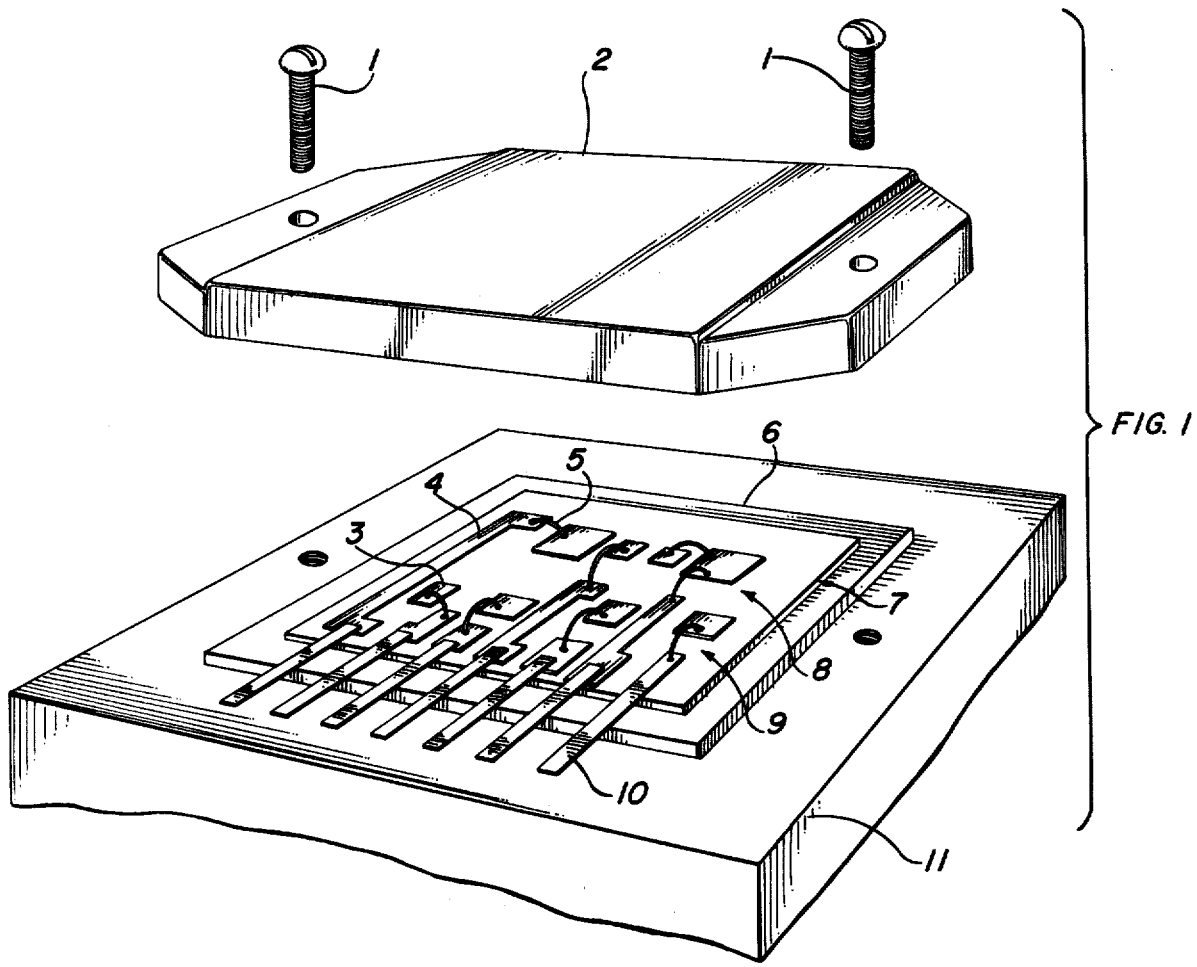
FIG. 1 is a perspective view showing one possible representation of a pulse width modulated (PWM) audio amplifier constructed using hybrid techniques.

It is not the intent of this document to specifically define the detailed circuit design of the pulse width modulated (PWM) audio amplifier circuitry or the exact physical construction of the "hybrid" circuit. Instead it is to be shown that the technology in these two areas has advanced to a point where the union of the two, for the first time, can evolve a new product that is unique, patentable, and saleable.

Although the PWM amplifier technique is not new and is described in other publications, a brief description of the technique will be given as a point of definition pertaining to this document. This is a general definition and is not to be construed as a final or all encompassing definition as referenced to this patent. In a PWM amplifier, the output active devices are used only as a switch i.e., they are either in the "on" state or the "off" state and are not in the "linear" or "in between" state except for a very brief period during transition. The active output switches are continuously switching from one D.C. output supply rail to the other, normally at a constant carrier or chop frequency which is usually at least a factor of five higher than the maximum expected usable output frequency of the audio amplifier. The resultant rectangular waveform is fed into an output filter normally consisting of some combination of inductors or capacitors whose purpose is to strip off the carrier or chop frequency and pass the resultant amplitude derived from the duty cycle or pulse width of the rectangular wave. Hence the terminology "pulse width modulation" (PWM). As the output pulse width is modulated or changed, the output from the filter constitutes a magnitude roughly proportional to the pulse width change. This results in a useful high power output with very low output active device power dissipation, which in turn equates to increased efficiency.

As shown in FIG. 1, PWM switching output stage just described 8, possibly excluding the inductor-capacitor output filter components, but including any necessary PWM control electronics 9 would be mounted on or constructed as part of the hybrid substrate 7. The electrical insulating and thermal conducting substrate 7 could be fabricated of any of the commonly used materials such as ceramic, alumina, or mylar; however, the exact material is not important to this patent. Electrical conducting metalization interconnects 4 and bonding wires 5 connect together the electronic chips 3 necessary to form the PWM circuit on the insulating substrate 7. Hybrid substrate 7 is normally mounted to hybrid baseplate 6 and baseplate 6 attached to hybrid protective cover 2. Then protective cover 2 along with hybrid assembly 3,4,5,6,7,8,9,&10 would normally be mounted with appropriate fastener 1 to an external thermal heat sink 11. Electrical contact to external electronic devices could be made at contact pins 10.

The physical appearance, shape, size, or orientation of any of the component parts 1 through 11 has no bearing on this patent. A hybrid product can be constructed in any number of case sizes, shapes, and using many different kinds of materials. FIG. 1 does not represent a design that is any better or any worse than any other, but is only meant to be an example of one possible configuration and in no way should construe or imply the fact that this is the only configuration possible.

In the art the normal complete audio frequency range is 20 to 20,000 cycles per second, however for the purposes of this patent, an audio amplifier could have a frequency range either inside or outside the 20 to 20,000 cycles per second range and is primarily designed to be used or is being used as an audio amplifier to drive some type of loudspeaker where the primary intent is listening to the program material emitting from the loudspeaker.

It is the intent of the patent not only to cover a single PWM audio amplifier constructed in a single package using hybrid techniques but also to cover two, three, or any multiple thereof independent PWM audio amplifiers that would be constructed in a single package using hybrid techniques. In each of these cases, essentially the entire PWM basic audio amplifier or amplifiers would be contained in the hybrid circuit with the exception of the output inductor-capacitor filters which most likely would be external to the hybrid circuit.

I claim:
1. An amplifier comprising:
   a hybrid substrate; and
   power amplifier means integral to said substrate for providing a pulse width modulated (PWM) power output signal.
2. The amplifier of claim 1 wherein said power amplifier means includes electronic chip components mounted and electrically connected on said substrate.
3. The amplifier of claim 1 wherein said power amplifier means is responsive to signals in the audio frequency range.
4. The amplifier of claim 1 wherein said hybrid substrate and said power amplifier means are enclosed in a single package.
5. The amplifier of claim 1 wherein said power amplifier means includes one or more independent amplifiers.
6. An amplifier for use with output filtering circuitry comprising:
   an electrically insulating and thermally conducting hybrid substrate; and
   power amplifier means integral to said substrate for providing a pulse width modulated (PWM) power output signal to the filtering circuitry so that the filtering circuitry provides a filtered output having a magnitude which varies in a roughly proportinal manner to the change in width of said PWM power output signal.
7. The amplifier of claim 6 wherein said amplifier means includes electronic chip components for providing said PWM power output signal.
8. The amplifier of claim 6 wherein said power amplifier means is responsive to signals in the audio frequency range.
9. The amplifier of claim 6 wherein said substrate and said power amplifier means are enclosed in a single package.
10. The amplifier of claim 6 wherein said power amplifier means includes one or more independent amplifiers.
11. A pulse modulated power amplifier for use directly into an inductive load, comprising:
    a hybrid substrate;

power amplifier means constructed with electronic chip components on said hybrid substrate for providing a pulse width modulated (PWM) power output signal directly into an inductive load where the load is capable of retrieving the desired resultant signal output derived from the pulse width of said PWM power amplifier output.

12. The amplifier of claim 11 wherein said pulse width modulated power amplifier means has a bandwidth equal to or contained within the audio frequency range.

13. The amplifier of claim 11 wherein said hybrid substrate and power amplifier means are enclosed in a single package.

14. The amplifier of claim 11 wherein said power amplifier means includes one or more independent amplifiers.

* * * * *